United States Patent
Wilson et al.

(10) Patent No.: US 7,545,029 B2
(45) Date of Patent: Jun. 9, 2009

(54) STACK MICROELECTRONIC ASSEMBLIES

(75) Inventors: Stuart E. Wilson, Menlo Park, CA (US); Ronald Green, San Jose, CA (US); Richard Dewitt Crisp, Castro Valley, CA (US); Giles Humpston, Aylesbury (GB)

(73) Assignee: Tessera, Inc., San Jose, CA (US)

( * ) Notice: Subject to any disclaimer, the term of this patent is extended or adjusted under 35 U.S.C. 154(b) by 247 days.

(21) Appl. No.: 11/506,472

(22) Filed: Aug. 18, 2006

(65) Prior Publication Data

US 2008/0042250 A1 Feb. 21, 2008

(51) Int. Cl.
*H01L 23/02* (2006.01)
*H05K 7/00* (2006.01)
*H01L 21/00* (2006.01)

(52) U.S. Cl. .................. 257/685; 257/686; 257/701; 257/724; 257/782; 257/E25.013; 257/E21.614; 361/777; 361/784; 438/107; 438/109

(58) Field of Classification Search .................. None
See application file for complete search history.

(56) References Cited

U.S. PATENT DOCUMENTS

| | | | |
|---|---|---|---|
| 3,390,308 | A | 6/1968 | Marley |
| 3,923,359 | A | 12/1975 | Newsam |
| 4,371,744 | A | 2/1983 | Badet et al. |
| 4,371,912 | A | 2/1983 | Guzik |
| 4,489,364 | A | 12/1984 | Chance |
| 4,540,226 | A | 9/1985 | Thompson et al. |

(Continued)

FOREIGN PATENT DOCUMENTS

JP 52-075981 6/1977

(Continued)

OTHER PUBLICATIONS

North Corporation, "Processed Intra-layer Interconnection Material for PWBs [Etched Copper Bump with Copper Foil]," NMBI™, Version 2001.6.

(Continued)

*Primary Examiner*—Alonzo Chambliss
(74) *Attorney, Agent, or Firm*—Lerner, David, Littenberg, Krumholz & Mentlik, LLP

(57) ABSTRACT

A stacked microelectronic assembly includes a base substrate having conductive elements projecting from a bottom surface thereof and a first microelectronic subassembly underlying a bottom surface of the base substrate. The first microelectronic subassembly includes a first dielectric substrate, a first microelectronic element connected with the first dielectric substrate and first conductive posts projecting from the first dielectric substrate toward the bottom surface of the base substrate for electrically interconnecting the first microelectronic element and the base substrate. The assembly also has a second microelectronic subassembly overlying the base substrate. The second microelectronic subassembly includes a second dielectric substrate, a second microelectronic element connected with the second dielectric substrate and second conductive posts projecting toward the top surface of the base substrate for electrically interconnecting the second microelectronic element and the base substrate. The first microelectronic subassembly has a first height and the conductive elements projecting from the bottom surface of the base substrate have a second height that is greater than the first height of the first microelectronic subassembly.

49 Claims, 8 Drawing Sheets

U.S. PATENT DOCUMENTS

| | | |
|---|---|---|
| 4,551,746 A | 11/1985 | Gilbert et al. |
| 4,558,397 A | 12/1985 | Olsson |
| 4,638,348 A | 1/1987 | Brown et al. |
| 4,734,825 A | 3/1988 | Peterson |
| 4,754,316 A | 6/1988 | Reid |
| 4,761,681 A | 8/1988 | Reid |
| 4,804,132 A | 2/1989 | DiFrancesco |
| 4,841,355 A | 6/1989 | Parks |
| 4,868,712 A | 9/1989 | Woodman |
| 4,897,918 A | 2/1990 | Osaka et al. |
| 4,941,033 A | 7/1990 | Kishida |
| 4,956,694 A | 9/1990 | Eide |
| 4,975,079 A | 12/1990 | Beaman et al. |
| 4,982,265 A | 1/1991 | Watanabe et al. |
| 4,994,902 A | 2/1991 | Okahashi et al. |
| 4,996,583 A | 2/1991 | Hatada |
| 4,996,587 A | 2/1991 | Hinrichsmeyer et al. |
| 5,028,986 A | 7/1991 | Sugano et al. |
| 5,045,921 A | 9/1991 | Lin et al. |
| 5,083,697 A | 1/1992 | Difrancesco |
| 5,117,282 A | 5/1992 | Salatino |
| 5,128,831 A | 7/1992 | Fox, III et al. |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bernardoni et al. |
| 5,189,505 A | 2/1993 | Bartelink |
| 5,196,726 A | 3/1993 | Nishiguchi et al. |
| 5,198,888 A | 3/1993 | Sugano et al. |
| 5,214,308 A | 5/1993 | Nishiguchi et al. |
| 5,222,014 A | 6/1993 | Lin |
| 5,247,423 A | 9/1993 | Lin et al. |
| 5,281,852 A | 1/1994 | Normington |
| 5,311,401 A | 5/1994 | Gates, Jr. et al. |
| 5,313,096 A | 5/1994 | Eide |
| 5,334,875 A | 8/1994 | Sugano et al. |
| 5,347,159 A | 9/1994 | Khandros et al. |
| 5,376,825 A | 12/1994 | Tukamoto et al. |
| 5,384,689 A | 1/1995 | Shen |
| 5,397,916 A | 3/1995 | Normington |
| 5,397,997 A | 3/1995 | Tuckerman et al. |
| 5,412,247 A | 5/1995 | Martin |
| 5,414,298 A | 5/1995 | Grube et al. |
| 5,455,390 A | 10/1995 | DiStefano et al. |
| 5,455,740 A | 10/1995 | Burns |
| 5,479,318 A | 12/1995 | Burns |
| 5,489,749 A | 2/1996 | DiStefano et al. |
| 5,518,964 A | 5/1996 | DiStefano et al. |
| 5,543,664 A | 8/1996 | Burns |
| 5,548,091 A | 8/1996 | DiStefano et al. |
| 5,552,631 A | 9/1996 | McCormick |
| 5,552,963 A | 9/1996 | Burns |
| 5,600,541 A | 2/1997 | Bone et al. |
| 5,608,265 A | 3/1997 | Kitano et al. |
| 5,616,958 A | 4/1997 | Laine et al. |
| 5,625,221 A | 4/1997 | Kim et al. |
| 5,637,536 A | 6/1997 | Val et al. |
| 5,639,695 A | 6/1997 | Jones et al. |
| 5,642,261 A | 6/1997 | Bond et al. |
| 5,656,856 A | 8/1997 | Kweon |
| 5,659,952 A | 8/1997 | Kovac et al. |
| 5,668,405 A | 9/1997 | Yamashita |
| 5,677,566 A | 10/1997 | King et al. |
| 5,679,977 A | 10/1997 | Khandros et al. |
| 5,681,777 A | 10/1997 | Lynch et al. |
| 5,701,031 A | 12/1997 | Oguchi et al. |
| 5,731,709 A | 3/1998 | Pastore et al. |
| 5,734,555 A | 3/1998 | McMahon |
| 5,751,063 A | 5/1998 | Baba |
| 5,783,870 A | 7/1998 | Mostafazadeh et al. |
| 5,784,264 A | 7/1998 | Tanioka |
| 5,801,072 A | 9/1998 | Barber |
| 5,801,439 A | 9/1998 | Fujisawa et al. |
| 5,802,699 A | 9/1998 | Fjelstad et al. |
| 5,804,874 A | 9/1998 | An et al. |
| 5,834,339 A | 11/1998 | Distefano et al. |
| 5,835,988 A | 11/1998 | Ishii et al. |
| 5,844,315 A | 12/1998 | Melton et al. |
| 5,861,666 A | 1/1999 | Bellaar |
| 5,883,426 A | 3/1999 | Tokuno et al. |
| 6,030,856 A | 2/2000 | DiStefano et al. |
| 6,054,756 A | 4/2000 | DiStefano et al. |
| 6,072,233 A | 6/2000 | Corisis et al. |
| 6,093,029 A | 7/2000 | Kwon et al. |
| 6,121,676 A | 9/2000 | Solberg |
| 6,177,636 B1 | 1/2001 | Fjelstad |
| 6,180,881 B1 | 1/2001 | Isaak |
| 6,195,268 B1 | 2/2001 | Eide |
| 6,202,297 B1 | 3/2001 | Faraci et al. |
| 6,218,848 B1 | 4/2001 | Hembree et al. |
| 6,225,688 B1 | 5/2001 | Kim et al. |
| 6,232,152 B1 | 5/2001 | DiStefano et al. |
| 6,258,625 B1 | 7/2001 | Brofman et al. |
| 6,268,649 B1 | 7/2001 | Corisis et al. |
| 6,291,259 B1 | 9/2001 | Chun |
| 6,303,997 B1 | 10/2001 | Lee et al. |
| 6,310,386 B1* | 10/2001 | Shenoy .................. 257/531 |
| 6,313,522 B1 | 11/2001 | Akram et al. |
| 6,335,565 B1 | 1/2002 | Miyamoto et al. |
| 6,342,728 B2 | 1/2002 | Miyazaki et al. |
| 6,365,975 B1 | 4/2002 | DiStefano et al. |
| 6,369,445 B1 | 4/2002 | Khoury |
| 6,388,264 B1 | 5/2002 | Pace |
| 6,417,688 B1 | 7/2002 | Dabral et al. |
| 6,458,411 B1 | 10/2002 | Goossen et al. |
| 6,462,421 B1 | 10/2002 | Hsu et al. |
| 6,465,878 B2 | 10/2002 | Fjelstad et al. |
| 6,495,914 B1 | 12/2002 | Sekine et al. |
| 6,496,026 B1 | 12/2002 | Long et al. |
| 6,515,870 B1 | 2/2003 | Skinner et al. |
| 6,521,984 B2* | 2/2003 | Matsuura .................. 257/678 |
| 6,550,666 B2 | 4/2003 | Chew et al. |
| 6,578,754 B1 | 6/2003 | Tung |
| 6,624,653 B1 | 9/2003 | Cram |
| 6,699,730 B2 | 3/2004 | Kim et al. |
| 6,770,980 B2* | 8/2004 | Shibata .................. 257/777 |
| 6,774,317 B2 | 8/2004 | Fjelstad |
| 6,826,827 B1 | 12/2004 | Fjelstad |
| 6,838,768 B2* | 1/2005 | Corisis et al. ............ 257/738 |
| 6,885,106 B1 | 4/2005 | Damberg et al. |
| 7,061,122 B2 | 6/2006 | Kim et al. |
| 7,098,070 B2* | 8/2006 | Chen et al. .............. 438/106 |
| 7,138,299 B2 | 11/2006 | Fjelstad |
| 7,294,928 B2 | 11/2007 | Bang et al. |
| 7,317,249 B2* | 1/2008 | Crisp et al. .............. 257/723 |
| 2004/0222518 A1 | 11/2004 | Haba et al. |
| 2005/0116326 A1 | 6/2005 | Haba et al. |
| 2005/0168231 A1 | 8/2005 | Kim |
| 2005/0173805 A1 | 8/2005 | Damberg et al. |
| 2005/0181544 A1 | 8/2005 | Haba et al. |
| 2005/0181655 A1 | 8/2005 | Haba et al. |
| 2005/0263868 A1* | 12/2005 | Aoyagi .................. 257/686 |
| 2005/0284658 A1 | 12/2005 | Kubota et al. |
| 2005/0285246 A1 | 12/2005 | Haba et al. |
| 2006/0027899 A1 | 2/2006 | Humpston et al. |
| 2006/0138647 A1 | 6/2006 | Crisp et al. |
| 2006/0208348 A1* | 9/2006 | Ohsaka et al. ........... 257/685 |
| 2006/0249857 A1 | 11/2006 | Haba et al. |
| 2007/0182018 A1* | 8/2007 | Pendse .................. 257/277 |

FOREIGN PATENT DOCUMENTS

| | | |
|---|---|---|
| JP | 56-61151 | 5/1981 |
| JP | 57-31166 A1 | 2/1982 |

| | | |
|---|---|---|
| JP | 58-178529 | 10/1983 |
| JP | 60-194548 | 3/1984 |
| JP | 61-029140 | 2/1986 |
| JP | 61-101067 | 5/1986 |
| JP | 61-120454 | 6/1986 |
| JP | 61-137335 | 6/1986 |
| JP | 61-255046 | 11/1986 |
| JP | 63-18654 | 1/1988 |
| JP | 62-226307 | 3/1989 |
| JP | 62-68015 A | 9/1994 |
| WO | WO-03/019654 | 3/2003 |

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
"Megabyte Per Cubic Inch," Defense Science, May 1988, p. 56.
"Three-Dimensional Packaging," Defense Science, May 1988, p. 65.
Newsam, U.S. Appl. No. 60/314,042, filed Aug. 22, 2001.
Forthun, U.S. Appl. No. 07/552,578, filed Jul. 13, 1990.
Bang, U.S. Appl. No. 60/408,644, filed Sep. 6, 2002.

* cited by examiner

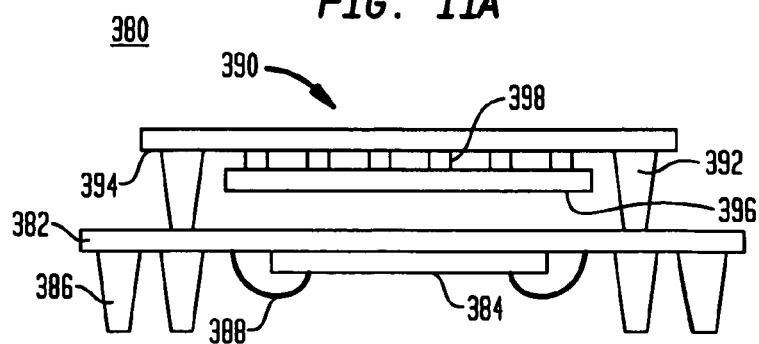
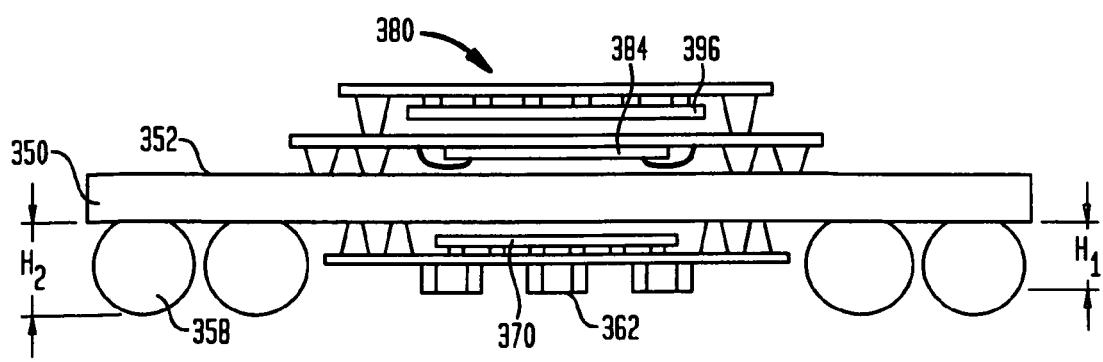

STACK MICROELECTRONIC ASSEMBLIES

CROSS REFERENCE TO RELATED APPLICATIONS

The present invention relates to stacked microelectronic assemblies, methods of making and testing such assemblies and to components useful in such assemblies.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric element. These terminals typically are connected to the contacts of the chip itself by features such as thin traces extending along the chip carrier and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Semiconductor chips are commonly provided as individual, prepackaged units. A standard chip has a flat, rectangular body with a large front face having contacts connected to the internal circuitry of the chip. Each individual chip typically is mounted in a package, which in turn is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of the circuit panel and the contacts on the chip are bonded directly to the circuit panel by solder balls or other connecting elements. The "flip chip" design provides a relatively compact planar arrangement; each chip occupies an area of the circuit panel equal to or slightly larger than the area of the chip front face. However, this approach suffers from cost and reliability problems. As disclosed, for example, in certain embodiments of commonly assigned U.S. Pat. Nos. 5,148, 265 5,148,266, and 5,679,977 the disclosures of which are incorporated herein by reference certain innovative mounting techniques offer compactness approaching or equal to that of conventional flip chip bonding without the reliability and testing problems commonly encountered in that approach. A Package which can accommodate a single chip in an area of the circuit panel equal to or slightly larger than the area of the chip itself are commonly referred to as "chip size packages".

Besides minimizing the planar area of the circuit panel occupied by a microelectronic assembly, it is also desirable to produce a chip package that presents a low overall height or dimension perpendicular to the plane of the circuit panel. Such thin microelectronic packages allow for placement of a circuit panel having the packages mounted thereon in close proximity to neighboring structures, thus reducing the overall size of the product incorporating the circuit panel.

Various proposals have been advanced for providing plural chips in a single package or module. In a conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module. It has also been proposed to package plural chips in a "stacked" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned '977 and '265 patents and in U.S. Pat. No. 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Another approach is presented in commonly assigned U.S. Pat. Nos. 6,121,676; 6,225,688; and U.S. patent application Ser. No. 09/776,356 filed Feb. 2, 2001, the disclosures of which are incorporated herein by reference. The stacked microelectronic assemblies disclosed certain preferred embodiments of these patents and application include a flexible substrate having a plurality of attachment sites and conductive elements and a plurality of chips connected thereto. The flexible substrate is folded so as to stack the chips in substantially vertical alignment with one another. The resulting stacked assemblies typically have at least one layer of flexible substrate for every one or two chips in the stack which adds to the overall thickness of the assembly.

Certain preferred embodiments of U.S. Pat. No. 5,861,666, the disclosure of which is incorporated herein by reference, disclose an assembly of plural chip-bearing units vertically stacked one atop the other. Each unit includes a small panel or "interposer" and a semiconductor chip mounted thereto. The assembly also includes compliant layers disposed between the chips and the interposers so as to permit relative movement of the chips and interposers to compensate for thermal expansion and contraction of the components. The units are stacked so that the chips overlie one another, and are electrically interconnected with one another as, for example, by solder balls connecting conductive features of adjacent interposers to one another. The presence of an interposer in each unit contributes to the thickness of the stack.

Still further improvements in stacked chip assemblies would be desirable. Stacked chip assemblies should deal effectively with the problems associated with heat generation in stacked chips. Chips dissipate electrical power as heat during operation. Where chips are stacked one atop the other, it is difficult to dissipate the heat generated by the chips in the middle of the stack. Also, chips and circuit panels undergo substantial thermal expansion and contraction during operation. Differences in thermal expansion and contraction can impose significant mechanical strain on elements of the assembly, including the electrical connections. Moreover, the assembly should be simple, reliable and easily fabricated in a cost-effective manner.

Despite all of the above-described advances in the art, still further improvements in making and testing microelectronic packages would be desirable.

SUMMARY OF THE INVENTION

In one preferred embodiment of the present invention, a stacked microelectronic assembly includes a base substrate having a top surface, a bottom surface and conductive elements projecting from the bottom surface thereof. The base substrate desirably has a plurality of conductive lands accessible at the bottom surface thereof. The conductive lands may be spaced from one another on a pitch of 400 microns or less. The conductive elements projecting from the base substrate are preferably solder spheres attached to the conductive lands, the solder spheres having a diameter of 375 microns or less. In certain preferred embodiments, the base substrate may be flexible. In other preferred embodiments, the base substrate may be rigid.

The stacked assembly desirably includes a first microelectronic subassembly underlying the bottom surface of the base substrate, the first microelectronic subassembly including a first dielectric substrate, a first microelectronic element connected with the first dielectric substrate and first conductive posts projecting from the first dielectric substrate toward the bottom surface of the base substrate for electrically interconnecting the first microelectronic element and the base substrate. The assembly also preferably includes a second microelectronic subassembly overlying the top surface of the base substrate, the second microelectronic subassembly including a second dielectric substrate, a second microelectronic element, such as a digital signal processing (DSP) die or a memory die, connected with the second dielectric substrate and second conductive posts projecting from the second dielectric substrate toward the top surface of the base substrate for electrically interconnecting the second microelectronic element and the base substrate. In certain preferred embodiments, at least one of the first and second dielectric substrates may be flexible. In other preferred embodiments, at least one of the first and second dielectric substrates may be rigid.

The first microelectronic subassembly preferably has a first height and the conductive elements projecting from the bottom surface of the base substrate have a second height that is greater than the first height of the first microelectronic subassembly. In preferred embodiments, the first microelectronic subassembly has a maximum height of 350 microns and the conductive elements projecting from the bottom surface of said base substrate have a minimum height of 350 microns. As a result, the conductive elements at the bottom of the stacked assembly may be connected to an external element such as a printed circuit board without the first subassembly contacting the external element.

In one preferred embodiment of the present invention, the base substrate is more rigid than the first and second dielectric substrates. The first and second dielectric substrates may comprise a flexible dielectric film or a polymeric material. The base substrate may comprise a polymeric or ceramic material.

In preferred embodiments, the bottom surface of the base substrate includes an area devoid of the conductive elements projecting from the bottom surface thereof and the first microelectronic subassembly is aligned with the area devoid of the conductive elements.

In one preferred embodiment, the first microelectronic element is a radio frequency (RF) die overlying a first surface of the first dielectric substrate. The first microelectronic subassembly may also include one or more passive components overlying a second surface of the first dielectric substrate, the one or more passive components being electrically interconnected with the RF die.

In one preferred embodiment, the first microelectronic element has a digital section and an analog section, with the first dielectric substrate having an area that is devoid of the first conductive posts, whereby the area that is devoid of the first conductive posts is in alignment with the analog section of the first microelectronic element.

The second microelectronic subassembly may also include a third dielectric substrate overlying the second dielectric substrate, with a third microelectronic element connected with the third dielectric substrate and third conductive posts projecting from the third dielectric substrate toward the second dielectric substrate. In these preferred embodiments, the second and third microelectronic elements are separated from one another by one of the second and third dielectric substrates. In one preferred embodiment, the second microelectronic element is a digital signal processing (DSP) die and the third microelectronic element is a memory die.

In one preferred embodiment of the present invention, a microelectronic package may include a global positioning system (GPS) receiver having at least three die including a radio frequency (RF) die, a digital signal processing (DSP) die and a memory die. Such a package can be incorporated into or be made part of any of the embodiments disclosed herein or incorporated by reference herein.

In another embodiment, the bottom surface of the base substrate has a recess formed therein and the first microelectronic subassembly is at least partially disposed in the recess for minimizing the height of the stacked microelectronic assembly. In these particular embodiments, the first microelectronic subassembly comprises at least one passive component overlying a top surface of the first dielectric substrate and the at least one passive component is at least partially disposed in the recess formed in the base substrate.

In other preferred embodiments of the present invention, a stacked microelectronic assembly includes a base substrate including a top surface, a bottom surface and conductive elements projecting from the bottom surface thereof, an a microelectronic subassembly underlying the bottom surface of the base substrate. The microelectronic subassembly preferably includes a dielectric substrate having a top surface and a bottom surface, a first microelectronic element attached to the top surface of the dielectric substrate, a second microelectronic element attached to the bottom surface of the dielectric substrate and conductive posts projecting from the top surface of the dielectric substrate toward the bottom surface of the base substrate for electrically interconnecting the first and second microelectronic elements with the base substrate. The stacked assembly may also include a second microelectronic subassembly overlying the top surface of the base substrate, the second microelectronic subassembly including a second dielectric substrate, a second microelectronic element connected with the second dielectric substrate and second conductive posts projecting from the second dielectric substrate toward the top surface of the base substrate for electrically interconnecting the second microelectronic element and said the substrate.

In yet further preferred embodiments of the present invention, a stacked microelectronic assembly includes a base substrate including a top surface, a bottom surface and conductive elements projecting from the bottom surface thereof, and a multilayer microelectronic subassembly overlying the top surface of the base substrate. The multilayer microelectronic subassembly preferably includes a first dielectric substrate, a first semiconductor die connected with the first dielectric substrate and first conductive posts projecting from the first dielectric substrate for electrically interconnecting the first semiconductor die and the base substrate. The stacked assembly also preferably includes a second dielectric substrate overlying the first dielectric substrate, a second semiconductor die connected with the second dielectric substrate and second conductive posts projecting from the second dielectric substrate toward the first dielectric substrate.

In one preferred embodiment, the first and second dielectric substrates are more flexible than the base substrate. The first semiconductor die may be a digital signal processing (DSP) die and the second semiconductor die may be a memory die. The first and second semiconductor die are desirably separated from one another by one of the first and second dielectric substrates.

In still further preferred embodiments of the present invention, a stacked microelectronic assembly includes a base substrate having an outer perimeter defining an area, the base substrate including a top surface, a bottom surface and conductive elements projecting from the bottom surface. The assembly preferably includes a first microelectronic subassembly underlying the bottom surface of the base substrate, the first microelectronic subassembly including a first flexible dielectric substrate, a first microelectronic element connected with the first flexible dielectric substrate and first conductive posts projecting from the first flexible dielectric substrate toward the bottom surface of the base substrate for electrically interconnecting the first microelectronic subassembly and the base substrate. The assembly desirably includes a second microelectronic subassembly overlying the top surface of the base substrate, the second microelectronic subassembly including a second flexible dielectric substrate, a second microelectronic element connected with the second flexible dielectric substrate and second conductive posts projecting from the second dielectric substrate toward the top surface of the base substrate for electrically interconnecting the second microelectronic subassembly and the base substrate, whereby each of the first and second microelectronic elements covers an area that is greater than 50% of the area of the base substrate.

The second microelectronic subassembly may also include a third flexible dielectric substrate overlying the second flexible dielectric substrate, a third microelectronic element connected with the third flexible dielectric substrate and third conductive posts projecting from the third flexible dielectric substrate toward the second flexible dielectric substrate, whereby the third microelectronic element covers an area that is greater than 50% of the area of the base substrate. The stacked microelectronic assembly preferably has a thickness of less than 1 mm.

In yet further preferred embodiments of the present invention, a stacked microelectronic assembly includes a base substrate having a top surface, a bottom surface and conductive elements projecting from the bottom surface, a first microelectronic subassembly underlying the bottom surface of the base substrate, the first microelectronic subassembly including a first flexible dielectric substrate having a top surface and a bottom surface, a first microelectronic element overlying the top surface of the first flexible dielectric substrate and first conductive posts projecting from the top surface of the first flexible dielectric substrate toward the bottom surface of the base substrate for electrically interconnecting the first microelectronic element and the base substrate.

The stacked assembly preferably includes a second microelectronic subassembly overlying the top surface of the base substrate, the second microelectronic subassembly having a second flexible dielectric substrate with a top surface and a bottom surface, a second microelectronic element attached to the second flexible dielectric substrate and second conductive posts projecting from the bottom surface of the second flexible dielectric substrate toward the top surface of the base substrate for electrically interconnecting the second microelectronic element and the base substrate. The second microelectronic subassembly also preferably includes a third flexible dielectric substrate overlying the second flexible dielectric substrate, the third flexible dielectric substrate having a top surface and a bottom surface, a third microelectronic element attached to the third flexible dielectric substrate and third conductive posts projecting from the bottom surface of the third flexible dielectric substrate toward the top surface of the second flexible dielectric substrate for electrically interconnecting the third microelectronic element and the base substrate.

BRIEF DESCRIPTION OF THE DRAWINGS

FIGS. 11A and 11B show a method of making a stacked microelectronic assembly using the first and second substrates shown in FIGS. 8A-8B and 9, in accordance with one preferred embodiment of the present invention.

DETAILED DESCRIPTION

Figure 1:
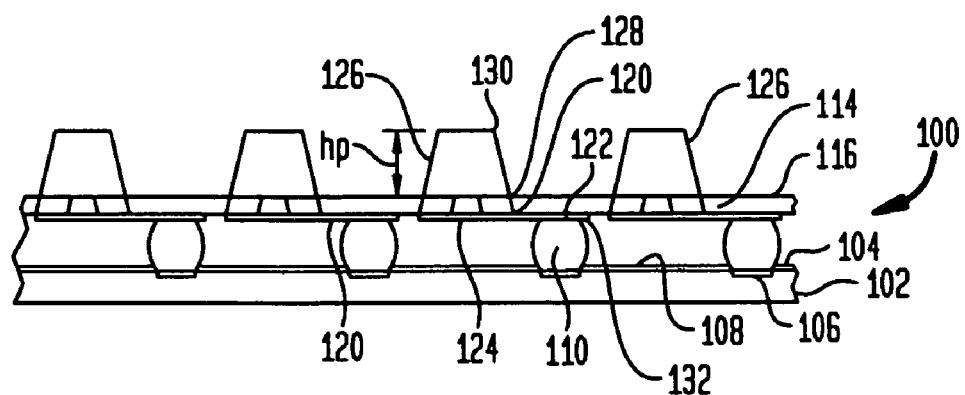
FIG. 1 is a diagrammatic sectional view of a package according to one embodiment of the invention.

In accordance with one preferred embodiment of the present invention, a microelectronic package 100 includes a microelectronic element, such as a semiconductor chip 102, having a front or contact bearing face 104 and electrical contacts 106 exposed at face 104. A passivation layer 108 may be formed over the contact bearing face 104 with openings at contacts 106.

Figure 2:
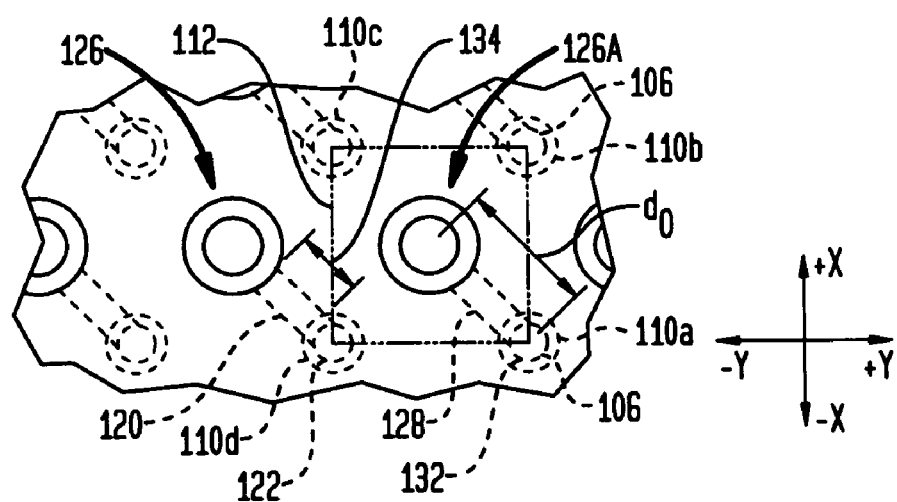
FIG. 2 is a fragmentary plan view of the package shown in FIG. 1.

The microelectronic package 100 also includes conductive support elements 110 such as solder balls in substantial alignment and electrically interconnected with contacts 106. As best seen in FIG. 2, contacts 106 and support elements 110 are disposed in an array which in this case is a rectilinear grid, having equally spaced columns extending in a first horizontal direction x and equally spaced rows extending in a second horizontal direction y orthogonal to the first horizontal direction. Each contact 106 and support element 110 is disposed at an intersection of a row and a column, so that each set of four support elements 110 at adjacent intersections, such as support elements 110a, 110b, 110c and 110d, defines a generally rectangular, and preferably square, zone 112. The directions referred to in this disclosure are directions in the frame of reference of the components themselves, rather than in the normal gravitational frame of reference. Horizontal directions are directions parallel to the plane of the front surface 104 of the chip, whereas vertical directions are perpendicular to that plane.

The package also includes a flexible dielectric substrate 114, such as a polyimide or other polymeric sheet, including a top surface 116 and a bottom surface 118 remote therefrom. Although the thickness of the dielectric substrate will vary with the application, the dielectric substrate most typically is about 10 µm-100 µm thick. The flexible substrate 114 has conductive traces 120 thereon. In the particular embodiment illustrated in FIG. 1, the conductive traces are disposed on the bottom surface 118 of the flexible substrate 114. In other preferred embodiments, however, the conductive traces 120 may extend on the top surface 116 of the flexible substrate 114, on both the top and bottom faces or within the interior of the flexible substrate 114. Thus, as used in this disclosure, a statement that a first feature is disposed "on" a second feature should not be understood as requiring that the first feature lie on a surface of the second feature. Conductive traces 96 may be formed from any electrically conductive material, but most typically are formed from copper, copper alloys, gold or combinations of these materials. The thickness of the traces will also vary with the application, but typically is about 5 µm-25 µm. Traces 120 are arranged so that each trace has a support end 122 and a post end 124 remote from the support end.

Electrically conductive posts or pillars 126 project from the top surface 116 of flexible substrate 114. Each post 126 is connected to the post end 124 of one of the traces 120. In the particular embodiment of FIGS. 1 and 2, the posts 126 extend upwardly through the flexible substrate 114, from the post ends of the traces. The dimensions of the posts can vary over a significant range, but most typically the height $h_p$ of each post above the top surface 116 of the flexible substrate is about 50-300 µm. Each post has a base 128 adjacent the flexible substrate 114 and a tip 130 remote from the flexible substrate. In the particular embodiment illustrated, the posts are generally frustoconical, so that the base 128 and tip 130 of each post are substantially circular. The bases of the posts typically are about 100-600 µm in diameter, whereas the tips typically are about 40-200 µm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

The dielectric substrate 114, traces 120 and posts 126 can be fabricated by a process such as that disclosed in co-pending, commonly assigned U.S. Provisional Patent Application Ser. No. 60/508,970, the disclosure of which is incorporated by reference herein. As disclosed in greater detail in the '970 Application, a metallic plate is etched or otherwise treated to form numerous metallic posts projecting from the plate. A dielectric layer is applied to this plate so that the posts project through the dielectric layer. An inner or side of the dielectric layer faces toward the metallic plate, whereas the outer side of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

As best appreciated with reference to FIG. 2, the support ends 122 of the leads are disposed in a regular grid pattern corresponding to the grid pattern of the support elements, whereas the posts 126 are disposed in a similar grid pattern. However, the grid pattern of the posts is offset in the first and second horizontal directions x and y from the grid pattern of the support ends 122 and support elements 110, so that each post 126 is offset in the −y and +x directions from the support end 122 of the trace 120 connected to that post.

The support end 122 of each trace 120 overlies a support element 110 and is bonded to such support element, so that each post 126 is connected to one support element. In the embodiment illustrated, where the support elements are solder balls, the bonds can be made by providing the support elements on the contacts 106 of the chip and positioning the flexible substrate 114, with the posts and traces already formed thereon, over the support elements and reflowing the solder balls by heating the assembly. In a variant of this process, the solder balls can be provided on the support ends 122 of the traces. The process steps used to connect the support ends of the traces can be essentially the same used in flip-chip solder bonding of a chip to a circuit panel.

As mentioned above, the posts 126 are offset from the support elements 110 in the x and y horizontal directions. Unless otherwise specified herein, the offset distance $d_o$ (FIG. 2) between a post and a support element can be taken as the distance between the center of area of the base 128 (FIG. 1) of the post and the center of area of the upper end 132 (FIG. 1) of the support element 110. In the embodiment shown, where both the base of the post and the upper end of the support element have circular cross-sections, the centers of area lie at the geometric centers of these elements. Most preferably, the offset distance $d_o$ is large enough that there is a gap 134 (FIG. 2) between adjacent edges of the base of the post and the top end of the support element. Stated another way, there is a portion of the dielectric substrate 114 in gap 134, which is not in contact with either the top end 132 of the support element or the base 128 of the post.

Each post lies near the center of one zone 112 defined by four adjacent support elements 110, so that these support elements are disposed around the post. For example, support elements 110a-110d are disposed around post 126A. Each post is electrically connected by a trace and by one of these adjacent support elements to the microelectronic device 102. The offset distances from a particular post to all of the support elements adjacent to that post may be equal or unequal to one another.

In the completed unit, the upper surface 116 of the flexible substrate 114 forms an exposed surface of the package, whereas posts 126 project from this exposed surface and provide terminals for connection to external elements.

The conductive support elements 110 create electrically conductive paths between the microelectronic element 102 and the flexible substrate 114 and traces 120. The conductive support elements space the flexible substrate 114 from the contact bearing face 104 of microelectronic element 102. As further discussed below, this arrangement facilitates movement of the posts 126.

Figure 3:
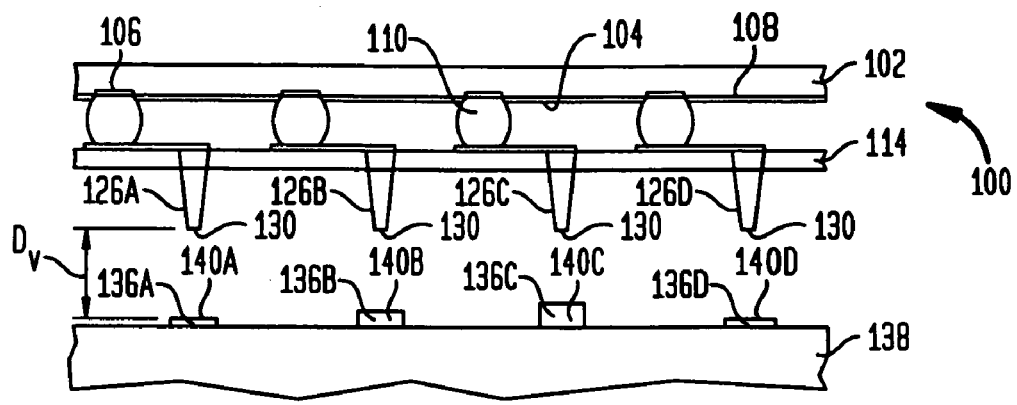
FIG. 3 is a diagrammatic elevational view depicting the package of FIGS. 1-2 in conjunction with a test circuit panel during one step of a method according to one embodiment of the invention.

Referring to FIG. 3, in a method of operation according to a further embodiment of the invention, a microelectronic package 100 such as the package discussed above with reference to FIGS. 1 and 2 is tested by juxtaposing the conductive posts 126 with contact pads 136 on a second microelectronic element 138 such as a circuitized test board. The conductive posts 126A-126D are placed in substantial alignment with top surfaces of the respective contact pads 136A-136D. As is evident in the drawing figure, the top surfaces 140A-140D of the respective contact pads 136A-136D are disposed at different heights and do not lie in the same plane. Such non-planarity can arise from causes such as warpage of the circuit board 138 itself and unequal thicknesses of contact pads 136. Also, although not shown in FIG. 3, the tips 130 of the posts may not be precisely coplanar with one another, due to factors such as unequal heights of support elements 110; non-planarity of the front surface 104 of the microelectronic device; warpage of the dielectric substrate 114; and unequal heights of the posts themselves. Also, the package 100 may be tilted slightly with respect to the circuit board. For these and other reasons, the vertical distances Dv between the tips of the posts and the contact pads may be unequal.

Figure 4:
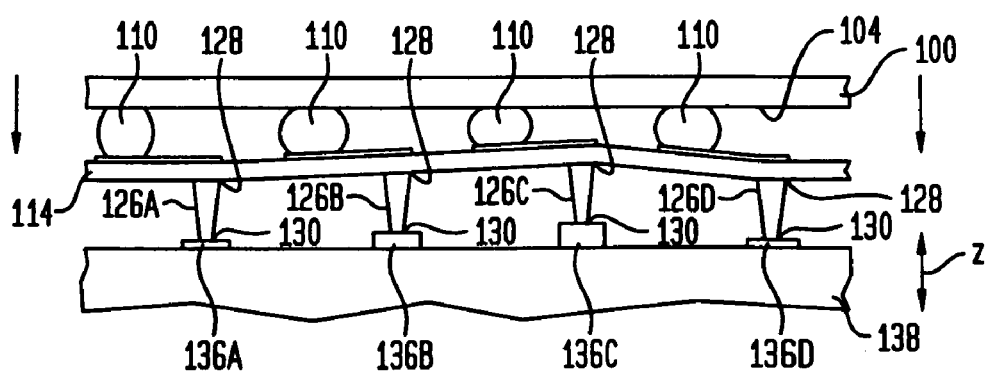
FIG. 4 is a view similar to FIG. 3 but depicting a later stage of the method.

Referring to FIG. 4, the microelectronic package 100 is moved toward the test board 138, by moving the test board, the package or both. The tips 130 of the conductive posts 126A-126D engage the contact pads 136 and make electrical contact with the contact pads. The tips of the posts are able to move so as to compensate for the initial differences in vertical spacing Dv (FIG. 3), so that all of the tips can be brought into contact with all of the contact pads simultaneously using only a moderate vertical force applied to urge the package and test board 138 together. In this process, at least some of the post tips are displaced in the vertical or z direction relative to other post tips.

A significant portion of this relative displacement arises from movement of the bases 128 of the posts relative to one another and relative to microelectronic element 100. Because the posts are attached to flexible substrate 114 and are offset from the support elements 110, and because the support elements space the flexible substrate 114 from the front surface 104 of the microelectronic element, the flexible substrate can deform. Further, different portions of the substrate associated with different posts can deform independently of one another.

Figure 5:
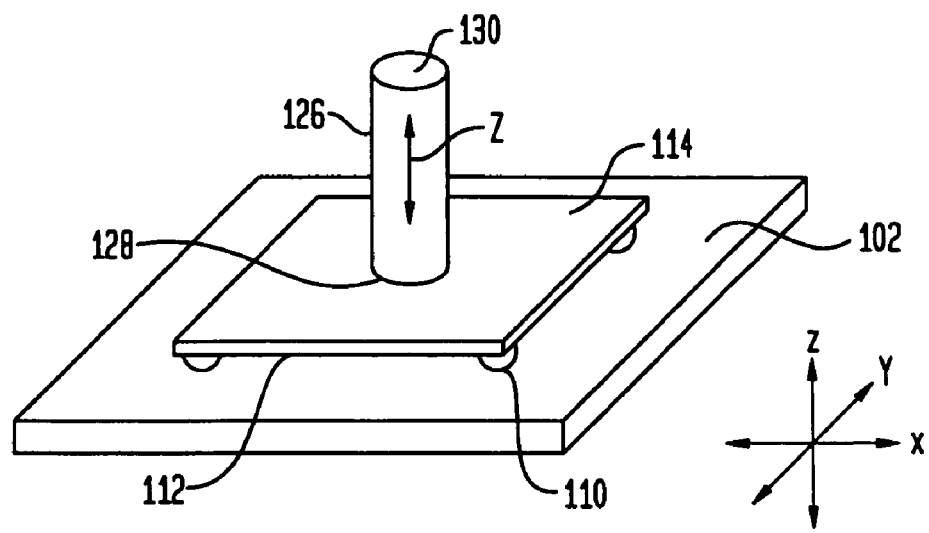
FIG. 5 is a diagrammatic, idealized perspective view depicting a portion of the package shown in FIGS. 1-4.

An idealized representation of the deformation of a single region 112 of substrate 114 is shown in FIG. 5. The support elements 110 disposed at the corners of the region allow the central part of the region to bend downwardly toward the microelectronic element 102, allowing the base 128 of post 126 to also move downward toward the microelectronic element. This deformation is idealized in FIG. 5 as a pure displacement of the post and the center of the region in the vertical or z direction. In practice, the deformation of the substrate may include bending and/or stretching of the substrate so that the motion of the base may include a tilting about an axis in the x-y or horizontal plane as well as some horizontal displacement of the base, and may also include other components of motion. For example, one portion of the region may be reinforced by a trace, and will tend to be stiffer than the other portions of the region. Also, a particular post may be positioned off-center in its region 112, so that the post lies closer to one support element, or to a pair of support elements, on one side of the post. For example, post 126a (FIG. 2) may be disposed closer to support elements 110a and 110b than to support elements 110c and 110d. The relatively small portion of the substrate between the post and support elements 110a and 110b will be stiffer in bending than the relatively large portion of the substrate between the posts and support elements 110c and 110d. Such non-uniformities tend to promote non-uniform bending and hence tilting motion of the posts. Tilting of the posts tends to move the tips 130 toward the microelectronic element. The support elements 110 at the corners of the individual regions substantially isolate the various regions from one another, so that the deformation of each region is substantially independent of the deformation of other regions of the substrate 114. Depending on the configuration of the posts, the posts 126 themselves may also flex or buckle to some degree, which provides additional movement of tips 76 in the vertical or z direction.

The independent displacement of the posts relative to one another allows all of the post tips 130 to contact all of the contact pads 136 on the test substrate. For example, the flexible substrate 114 in the vicinity of conductive post 126C flexes substantially more than the flexible substrate in the vicinity of conductive post 126B. In turn, the flexible substrate 114 in the vicinity of conductive post 126B flexes substantially more than the flexible substrate in the vicinity of conductive post 126A.

Because all of the post tips 130 can be engaged reliably with all of the contact pads 136, the package can be tested reliably by applying test signals, power and ground potentials through the test circuit board 138 and through the engaged posts and contact pads. Moreover, this reliable engagement is achieved with a simple test circuit board 138. For example, the contact pads 136 of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 μm of pin movement will suffice.

The internal features of package 100 are also compatible with high-frequency signals. The conductive support elements, traces and posts provide low-impedance signal paths between the tips of the posts and the contacts 106 of the microelectronic element. Because each post 126 is connected to an immediately adjacent conductive support element 110, traces 120 are quite short. The low-impedance signal paths are particularly useful in high-frequency operation, as, for example, where the microelectronic element must send or receive signals at a frequency of 300 MHz or more.

Figure 6:
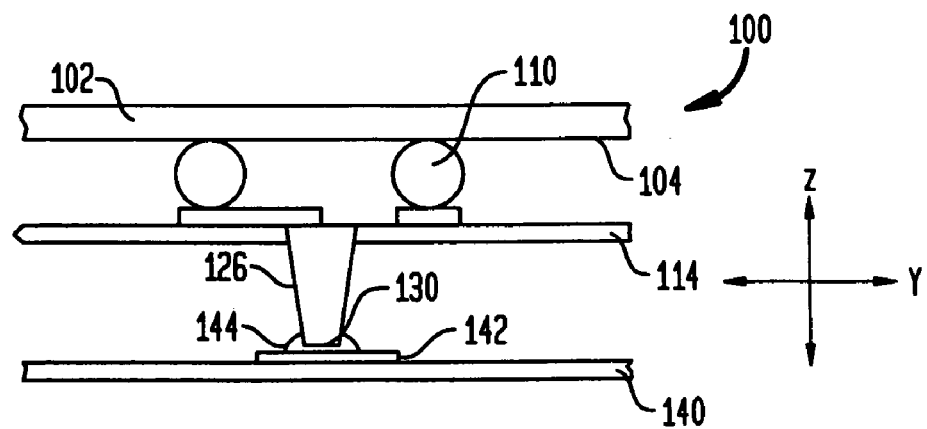
FIG. 6 is a fragmentary sectional view depicting a portion of an assembly including the package of FIGS. 1-5.

After testing the microelectronic package 100 may be removed from the test circuit board 138 and permanently interconnected with another substrate such as a circuit panel 140 (FIG. 6) having contact pads 142, as by bonding the tips 130 of posts 126 to the contact pads of the circuit panel using a conductive bonding material 144 such as a solder. The solder-bonding process may be performed using conventional equipment commonly used for surface-mounting microelectronic components. Thus, the solder masses may be provided on the posts 126 or on the contact pads 142, and may be reflowed after engaging the posts with the contact pads. During reflow, the surface tension of the solder tends to center the posts on the contact pads. Such self-centering action is particularly pronounced where the tips of the posts are smaller than the contact pads. Moreover, the solder 144 wets the sides of the posts to at least some extent, and thus forms a fillet encircling the tip of each post, as well as a strong bond between the confronting surfaces of the posts and pads.

Moreover, the tips 130 of the posts 126 can move relative to the microelectronic element 102 to at least some degree during service so as to relieve stresses arising from differential thermal expansion and contraction. As discussed above in connection with the testing step, the individual posts 126 can move relative to the microelectronic element and relative to the other posts by flexure or other deformation of substrate 114. Such movement can appreciably relieve stresses in the solder bonds between the posts and the contact pads, which would otherwise occur upon differential thermal expansion or contraction of the circuit board 140 and microelectronic element 102. Moreover, the conductive support elements or solder balls 110 can deform to further relieve stresses in solder masses 144. The assembly is highly resistant to thermal cycling stresses, and hence highly reliable in service.

An underfill material (not shown) such as an epoxy or other polymeric material may be provided around the tips of the posts and around the contact pads, so as to reinforce the solder bonds. Desirably, this underfill material only partially fills the gap between the package 100 and the circuit board 140. In this arrangement, the underfill does not bond the flexible substrate 114 or the microelectronic device to the circuit board. The underfill only reinforces the posts at their joints with the contact pads. However, no reinforcement is required at the bases of the posts, inasmuch as the joint between the base of each post and the associated trace is extraordinarily resistant to fatigue failure.

The assembly is also compact. Some or all of the posts 126 and contact pads 142 are disposed in the area occupied by the microelectronic element 102, so that the area of circuit board 140 occupied by the assembly may be equal to, or only slightly larger than, the area of the microelectronic element itself, i.e., the area of the front surface 104 of the microelectronic element 100.

Figure 7:
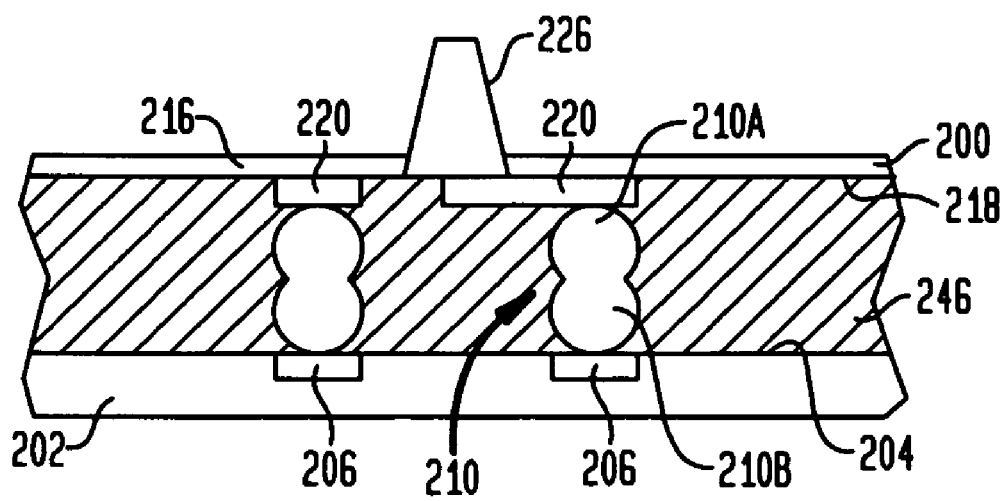
FIG. 7 is a fragmentary sectional view depicting a package, in accordance with another preferred embodiment of the present invention.

FIG. 7 shows a portion of a microelectronic package 200 in accordance with another embodiment of the present invention. This package includes a microelectronic element 202, such as a semiconductor chip, having contacts 206 on a face surface thereof. The package also includes a flexible substrate 214 such as a flexible dielectric film having a top surface 216, a bottom surface 218, conductive traces 220 and conductive posts 226 projecting from the top surface 216. The conductive posts 226 are electrically interconnected with traces 220 at the bases of the posts. One or more of the conductive traces 220 are electrically interconnected with contacts 206 by conductive elements 210. These features may be similar to the corresponding features of the embodiment discussed above with reference to FIGS. 1-6. In the embodiment shown in FIG. 7, each conductive support element 210 includes two conductive elements stacked one atop another so that a first conductive element 210A is positioned over a second conductive element 210B. Conductive elements 210A and 210B are fused with one another to from an elongated conductive element 210. In other preferred embodiments, three or more conductive elements may be stacked one atop another between conductive trace 220 and contact 206. The stacking of the conductive elements enables the height of the flexible substrate 214 to be adjusted relative to the surface of the semiconductor chip 202. This provides additional clearance between the flexible substrate 214 and the chip surface 204, which can accommodate additional displacement of the post bases. Moreover, the elongated conductive elements 210 are more readily deformable, which can provide additional movability to the posts.

In the embodiment of FIG. 7, a compliant material 246 is positioned between the flexible substrate 214 and the microelectronic element 202. The compliant layer 246 preferably does not substantially restrict movement of the posts. The compliant material prevents contaminants from entering the package. Merely by way of example, compliant material 246 may be a gel, foam or the like. Despite the presence of the compliant material, conductive elements 210 still support the flexible substrate 214 to a substantial degree.

Figure 8A:
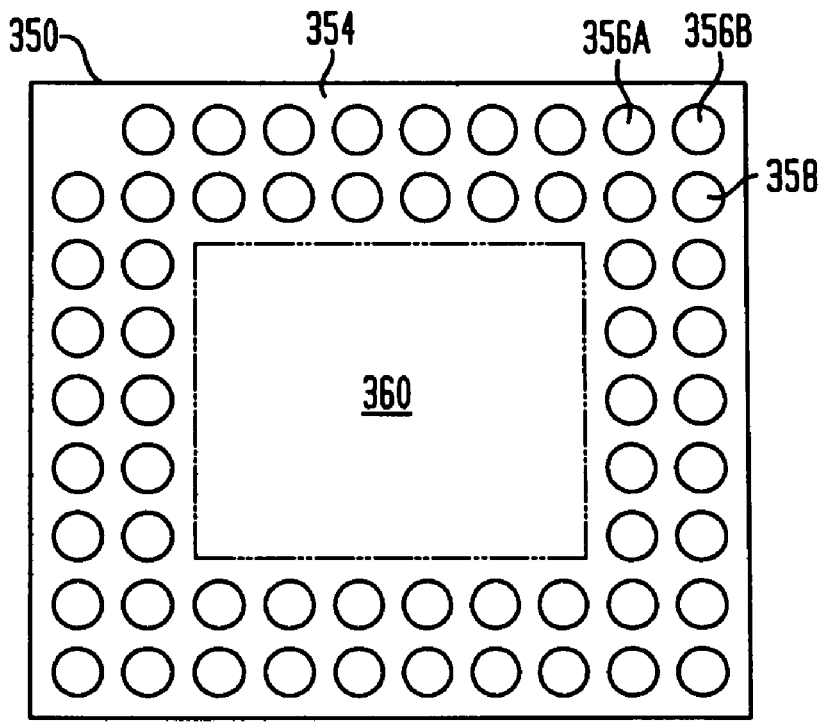
FIGS. 8A and 8B show respective bottom plan and side elevational views of a first substrate of a stackable microelectronic assembly, in accordance with certain preferred embodiments of the present invention.
Figure 8B:
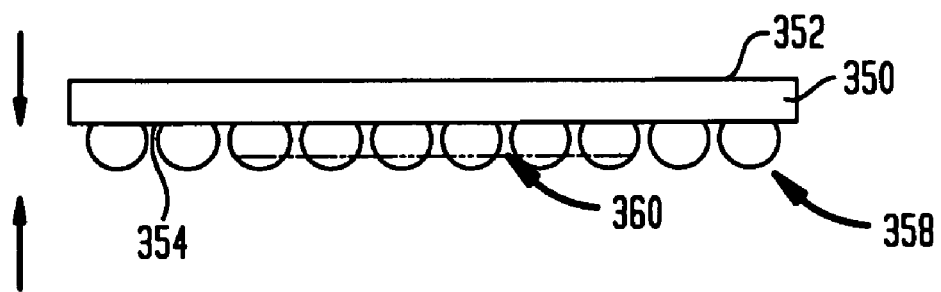

Referring to FIGS. 8A and 8B, in one preferred embodiment of the present invention, a stacked microelectronic assembly includes a base substrate 350 having a top surface 352 and a bottom surface 354. In one preferred embodiment, the base substrate 350 is a relatively rigid circuit board made of a polymeric material or a ceramic material, such as aluminum nitride or a low temperature co-fire ceramic (LTCC). The base substrate preferably carries sufficient wiring traces on the first and second surfaces 352, 354, interconnected by through vias at appropriate locations. The base substrate 350 preferably has some of the wiring traces terminating at conductive lands. As shown in FIG. 8A, these lands preferably form multiple rows 356A, 356B around the periphery of the bottom surface 354. Each if the lands is preferably adapted to accommodate a solder sphere 358. As will be described in more detail below, the solders spheres 358 preferably facilitate attachment and electrical interconnection between a stacked assembly and a printed circuit board or other circuitized substrate.

The solders sphere 358 attached to the base substrate 350 are desirably of the largest possible size that permits the lands to be placed at a 400 micrometer pitch. For free standing solders spheres, this means that the solder spheres should not exceed 375 micrometer in diameter to achieve manufacturing yields. Providing a 400 micrometer land pitch on a single or multiple rows provides the maximum possible number of interconnections in a given area that can be manufactured with good yield using known processes. Maximizing the size of the solders sphere is important because it provides the largest possible stand-off distance between a printed circuit board and the bottom surface 354 of the base substrate 350.

Referring to FIG. 8A, the first microelectronic element 350 preferably includes an open central area 360 that is adapted to receive a microelectronic element such as a radio frequency (RF) die (not shown).

Figure 9:
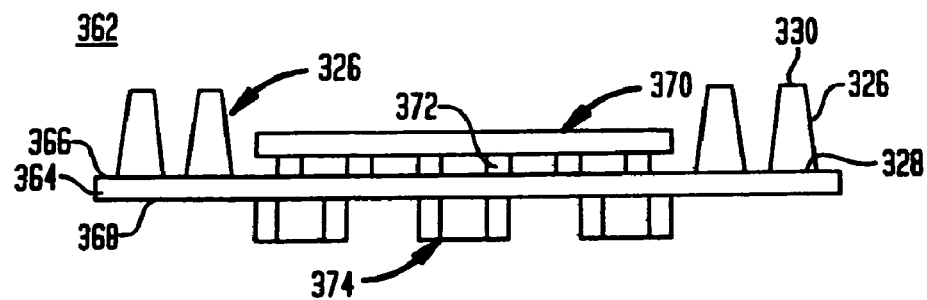
FIG. 9 shows a cross-sectional view of second substrate that is adapted to be assembled with the first substrate of FIGS. 8A and 8B, in accordance with one preferred embodiment of the present invention.

FIG. 9 shows a microelectronic subassembly 362 that is adapted for assembly with the base substrate 350 shown in FIGS. 8A and 8B. The microelectronic subassembly 362 includes a dielectric substrate 364, such as a flexible dielectric substrate, having a top surface 366 and a bottom surface 368 remote therefrom. The subassembly 362 includes a plurality of conductive posts 326. Each post 326 preferably has a base 328 adjacent to the top surface 366 of the dielectric substrate 364. Each posts also preferably includes a tip 330 spaced from the base 328. The posts 326 shown in FIG. 9 are referred to as "pin-out" posts because the bases of the post lie on a surface of the dielectric substrate 364. In other preferred embodiments, the conductive posts may extend through a dielectric substrate layer. Such conductive posts are referred to as "pin-in" posts because a portion of the posts extend through the dielectric substrate. The present invention contemplates that any of the packages and assemblies disclosed herein may have "pin-out" posts or ""pin-in" posts or a combination of "pin-out" and "pin-in" posts.

The subassembly 362 also preferably includes an RF die 370 overlying the top surface 366 of the dielectric substrate 364. The RF die 370 is electrically interconnected with the dielectric substrate 364. In preferred embodiments, the RF die 370 is electrically interconnected with the dielectric substrate 364 using conductive elements 372 such as stud bumps. In highly preferred embodiments, the active face of the RF die faces away from the bottom surface of the base substrate. The subassembly 362 also preferably includes one or more passive components 374 underlying the bottom surface 368 of the dielectric substrate 364.

In one preferred embodiment, it is desirable to have RF die located as closely as possible to the one or more passive components interconnected therewith so that the inductance and resistance of the wiring traces between the die of the wiring traces between the die and the passive components are as low as possible.

Preferred passive components include inductors, tuning capacitors, surface acoustic wave filters, baluns and decoupling capacitors. In preferred embodiments, the one or more passive components preferable face the active surface of the RF die 370. Such an arrangement is practical if the RF die 370 is placed on the top surface 366 of the dielectric substrate 364 and the passive components 374 are placed on the bottom surface 368 of the dielectric substrate 364, with the interconnections formed by a combination of a wiring trace and through vias on the dielectric substrate 364. The RF die 370 may be attached to the dielectric substrate 364 by well known methods such as thermosonic bonding of stud bumps or wire bonding. The passive components 374 may be attached to the dielectric substrate 364 by a suitable method such as soldering.

Utilizing a flexible dielectric substrate 364 between the RF die 370 and the passive component 374 provides a number of benefits and/or serves a number of functions. First, the circuitized, flexible dielectric substrate 364 may be made from a thin film of a thermally stable dielectric material, such as a polyimide material. Polyimide films may be less than 50 micrometers thick, which thereby assist in minimizing the total thickness or height of the subassembly 362. Second, the low modulus of the circuitized, flexible dielectric substrate effectively buffers the RF die 370 from strain arising from thermal expansion coefficients of the RF die 370 and other circuit element, such as printed circuit boards. Silicon RF die in particular are very sensitive to strain-induced changes to performance. As a result, the minimum recommended thickness of a silicon RF die is often 450 micrometers. Die of this thickness are taller than the solders sphere used between the rigid circuit board and the printed circuit board, which would prevent it from being mounted on the bottom surface of the base substrate 350 shown in FIG. 8B. The compliancy afforded by the polymer film 364 permits the RF die 370 to be thinner. Preferred thicknesses may be less than 100 micrometers. Third, the circuitized, flexible dielectric substrate 364 has conductive posts 362 formed thereon. The conductive posts provide a very low profile method of attaching an interconnecting the RF die 370 and the passive components 374 to the first microelectronic substrate 350 (FIG. 8B). In addition, providing conductive posts 362 enables the subassembly 362 to be tested prior to final assembly. The ability to test individual die and subassembly components before final assembly into a stacked assembly insures that only known good die (KGD) are used, thereby assuring a high-yield assembly for the module.

In one preferred embodiment, the thinning of the RF die 370 to less than 100 micrometers, together with the 50 micrometer thickness of the flexible dielectric substrate 364, leaves sufficient room for 0201 style capacitors, which are about 250 micrometers thick, to be added while remaining within the height of the solders spheres projecting from the bottom of the base substrate. The present invention, thereby exploits a combination of factors to achieve good electrical performance while providing a relatively thin stacked assembly.

Referring to FIG. 9, in one preferred embodiment, the locations of the RF die 370 and the passive components 374 may be swapped. Swapping the components may simplify assembly and/or permit a larger number of conductive pins 326 to be provided on the substrate 364 to provide interconnection to the base substrate 350 (FIG. 8B). In certain preferred embodiments, one or more of the die or passive components may be attached to the substrate 364 using wire bonds. In one embodiment, either dummy solder spheres, compliant bumps or a layer of a compliant material may be provided between the die/passive component and the substrate 364.

Figure 10:
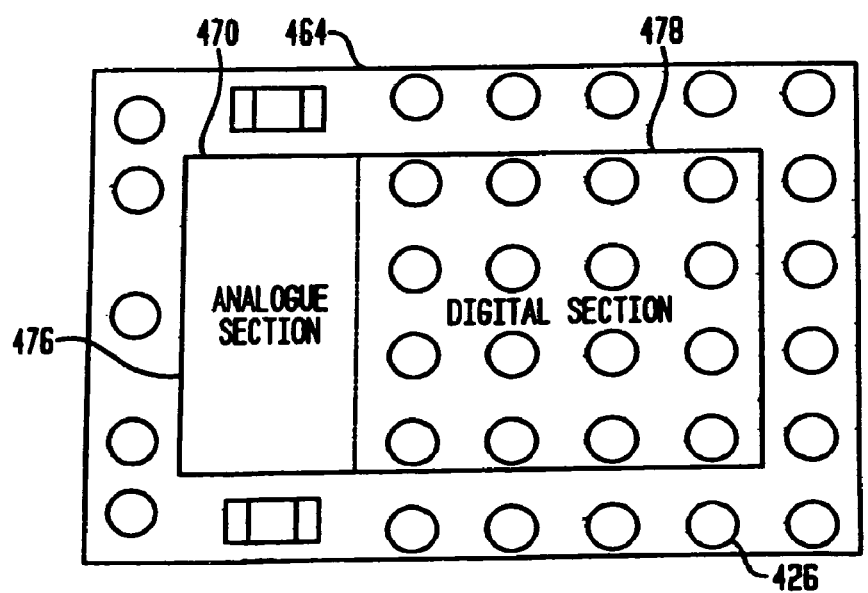
FIG. 10 shows a bottom plan view of a substrate for a stackable microelectronic assembly, in accordance with one preferred embodiment of the present invention.

Referring to FIG. 10, in accordance with another preferred embodiment of the present invention, the RF die 470 has an analog section 476 and a digital section 478. As is well-known to those skilled in the art, the analog sections of an RF die 470 are frequently sensitive to the proximity of metallic parts. Thus, in this preferred embodiment, conductive posts 426 are omitted from the area of the flexible dielectric substrate 464 underneath the analog section 476 of the RF die 470. Design of the analog section of the semiconductor is then greatly simplified since the interaction of its electromagnetic fields with external structure does not need to be taken into account. In other preferred embodiments, a substantially solid metal layer may be provided on an interposer underneath an analog area of the RF die 470, a plane or a mesh where the conductor spacing is less than ¼ wavelength. Such a structure preferably provides a predictable and stable electric field environment for the RF die and allows RF lines that are truly grounded, by virtue of their low impedance, to be brought right up to the die interface.

FIG. 11A shows a second subassembly 380 that is stackable atop the base substrate 350 shown in FIG. 8B. The second subassembly 380 includes a flexible dielectric substrate 382 having a digital signal processes (DSP) die 384 mounted thereon. The DSP die 384 is electrically interconnected with conductive posts 386. In one preferred embodiment, the DSP die 384 and the conductive posts 386 are electrically interconnected with one another using conductive wire 388.

The second subassembly 380 also includes a second flexible dielectric substrate 390 having conductive posts 392 projecting from a bottom surface 394 thereof. The second flexible dielectric substrate 390 includes a memory chip 396 assembled therewith. The memory-chip 396 may be electrically interconnected with the second dielectric substrate 390 and the conductive posts 392 using conductive masses 398 such as stud bumps.

As is well-known to those skilled in the art, a DSP die usually has a large number of inputs/outputs. For example, it is not uncommon for a 4 mm×4 mm DSP die to have 200 or more inputs/outputs. The subassembly 380 shown in FIG. 11A enables the high number of input/outputs to be connected to the base substrate 350 shown in FIG. 8B because of the relatively small diameter of the conductive posts 386, 392. Moreover, the structure of the subassembly shown in FIG. 11A enables various components to be tested prior to assembly. Furthermore, the structure enables the assembly to have a low profile height.

In the structure shown in FIG. 11A, many of the input/outputs on the DSP die 384 interface directly with the memory die 396. Direct interface of the DSP and memory die is preferred over routing the interconnections through the base substrate 350 of FIG. 8B. The later routing path may compromise the electrical performance due to the length of the conductors and may necessitate an enlargement of the base substrate 350 in order to achieve the required wiring density. Thus, a better solution is to use the direct interface structure shown and described above in reference to FIG. 11A. The use of the flexible dielectric substrates 382 and 394 of FIG. 11A simplifies the electrical of routing of the substrate 350 by eliminating routing signals used only for providing communication between the DSP die 384 and the memory chip 396. Instead, as shown in FIG. 11A, these electrical signals are directly connected between the DSP die 384 and the memory die 396 in their stacked configuration.

FIG. 11B shows a stacked assembly including the base substrate 350 of FIG. 8B, the first subassembly 362 of FIG. 9 and the second subassembly 380 of FIG. 11A. As shown in FIG. 11B, the profile height of the first subassembly is $H_1$ which is less than the height $H_2$ of the solders spheres 358. In preferred embodiments, the overall height of the stacked assembly shown in FIG. 11B is less than 1 mm. Moreover, as shown in FIG. 11B, the area covered by each of the RF die 370, the DSP die 384 and the memory die 396 is more than 50% of the plan area of the base substrate 350.

The stacked assembly shown in FIG. 11B may have an overmold formed thereon. In addition, an underfill material such as a compliant layer or compliant bumps may be disposed between the flexible dielectric substrates and the die or passive components. Depending upon the number and size of each die, the basic form of the assembly may be changed to provide more than one die under the bottom surface of the base substrate 350 or additional die stacks over the top surface of the base substrate 350. In addition, each level of the stack may include additional die. For example, additional die may be utilized in second subassembly 380 if the DSP die 384 requires both a dynamic random access memory (DRAM) and a flash random access memory for its function. Moreover, the top surface 352 of the base substrate 350 may accommodate other active or passive components.

Figure 12:
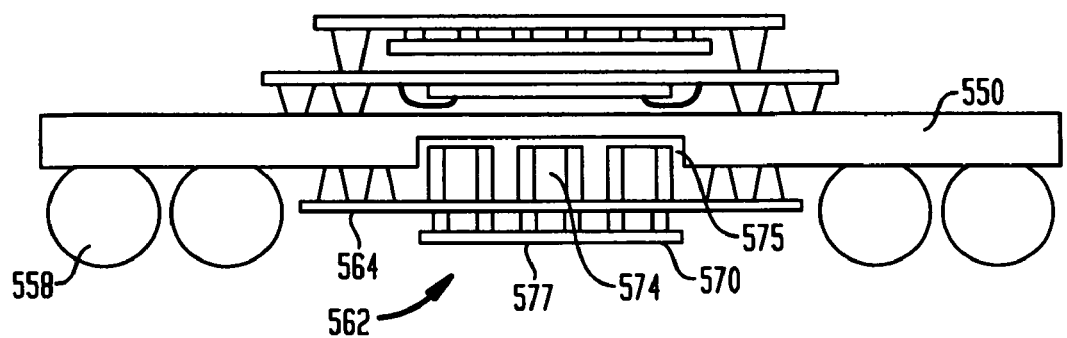
FIG. 12 shows a cross-sectional view of a stacked microelectronic assembly, in accordance with still further preferred embodiments of the present invention.

Referring to FIG. 12, in one preferred embodiment, there may be instances where the passive components 574 associated with the first microelectronic subassembly are too tall. In this situation, it is possible to transpose the location of the RF die 570 and the passive components 574 on the first flexible dielectric substrate 564 and form local recesses 575 in the base substrate 550. The recesses 575 are preferably of sufficient depth and dimension to accommodate enough of the thickness of the passive component(s) 574 so that the rear face 577 of the RF die 570 does not contact a printed circuit board when the stacked assembly is mounted to a printed circuit board using solders spheres. In other preferred embodiments, the base substrate 550 may include two or more recesses for accommodating respective assembly similar to the microelectronic subassembly 562 shown in FIG. 12. The recesses may be formed in either the top or bottom surfaces of the base substrate 550.

In further preferred embodiments, the stacked assembly may have one or more compliant layers extending between the substrates and the die or passive components. The compliant layer may include a porous compliant layer formed from a plurality of compliant pads defining channels between the pads. A curable elastomer may be injected in the channels between the compliant pads, as disclosed in commonly assigned U.S. Pat. No. 5,659,952, the disclosure of which is hereby incorporated by reference herein.

The foregoing discussion has referred to individual microelectronic elements, however, each layer of the subassemblies may include more than one microelectronic element or more than one substrate. Moreover, the process steps used to assemble the flexible dielectric substrates, the conductive posts and the microelectronic elements may be performed while the microelectronic elements are in the form of a wafer. A single large substrate may be assembled to an entire wafer, or to some portion of the wafer. The assembly may be severed so as to form individual units, each including one or more of the chips and the associated portion of the substrate. The testing operations discussed above may be performed prior to the severing step.

In one preferred embodiment of the present invention, a particle coating such as that disclosed in U.S. Pat. Nos. 4,804,132 and 5,083,697, the disclosures of which are incorporated by reference herein, may be provided on one or more electrically conductive parts of the assembly for enhancing the formation of electrical interconnections between microelectronic elements and for facilitating testing of microelectronic assemblies. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

In one preferred embodiment, an overmold may be formed around one or more layers of the stacked assembly. The overmold preferably covers the rear face and edges of the chip and the top surface of the flexible substrate. The overmold preferably prevents contamination of the assembly and adds stability to the package.

In one preferred embodiment of the present invention, the motion of the conductive posts may include a tilting motion, which causes the tip of each conductive post to wipe across an opposing contact pad as the tip is engaged with the contact pad. This promotes reliable electrical contact. As discussed in greater detail in the co-pending, commonly assigned application Ser. No. 10/985,126 filed Nov. 10, 2004, entitled "MICRO PIN GRID ARRAY WITH WIPING ACTION," the disclosure of which is incorporated by reference herein, the posts may be provided with features which promote such wiping action and otherwise facilitate engagement of the posts and contacts. As disclosed in greater detail in the co-pending, commonly assigned application Ser. No. 10/985,119 filed Nov. 10, 2004, entitled "MICRO PIN GRID WITH PIN MOTION ISOLATION," the disclosure of which is also incorporated by reference herein, the flexible substrate may be provided with features to enhance the ability of the posts to move independently of one another and which enhance the tilting and wiping action.

In one preferred embodiment of the present invention, a stackable assembly may include one or more of the embodiments or elements disclosed in commonly assigned U.S. Pat. Nos. 5,414,298, 6,177,636, 6,826,827, 6,774,317, 6,465,878 and 6,885,106; U.S. Patent Application Publication No. 2004/0262777; and U.S. patent application Ser. No. 10/980,381 filed Nov. 3, 2004, Ser. No. 10/786,819 filed Feb. 25, 2004, Ser. No. 10/959,465 filed Oct. 6, 2004, Ser. No. 11/166,982 filed Jun. 24, 2005, Ser. No. 11/019,600 filed Dec. 22, 2004, Ser. No. 11/014,439 filed Dec. 16, 2004, Ser. No. 10/985,126 filed Nov. 10, 2004, Ser. No. 10/985,119 filed Nov. 10, 2004, Ser. No. 11/021,627 filed Dec. 23, 2004, Ser. No. 11/140,312 filed May 27, 2005, Ser. No. 11/166,861 filed Jun. 24, 2005, Ser. No. 11/315,466 filed Dec. 22, 2005, 60/753,605 filed Dec. 23, 2005 and Ser. No. 11/318,404 filed Dec. 23, 2005, the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A stacked microelectronic assembly comprising:
a base substrate having a top surface, a bottom surface and conductive elements projecting from the bottom surface thereof;
a first microelectronic subassembly underlying the bottom surface of said base substrate, said first microelectronic subassembly including a first dielectric substrate, a first microelectronic element connected with said first dielectric substrate and first conductive posts projecting from said first dielectric substrate toward the bottom surface of said base substrate for electrically interconnecting said first microelectronic element and said base substrate, said first conductive posts having at least one of cylindrical or frusto-conical shape;
a second microelectronic subassembly overlying the top surface of said base substrate, said second microelectronic subassembly including a second dielectric substrate, a second microelectronic element connected with said second dielectric substrate and second conductive posts projecting from said second dielectric substrate toward the top surface of said base substrate for electrically interconnecting said second microelectronic element and said base substrate, wherein said first microelectronic subassembly has a first height and said conductive elements projecting from the bottom surface of said base substrate have a second height that is greater than the first height of said first microelectronic subassembly.

2. The assembly as claimed in claim 1, wherein said base substrate is more rigid than said first and second dielectric substrates.

3. The assembly as claimed in claim 2, wherein each of said first and second dielectric substrates comprises a flexible dielectric film.

4. The assembly as claimed in claim 2, wherein each of said first and second dielectric substrates comprises a polymeric material.

5. The assembly as claimed in claim 1, wherein said base substrate comprises a polymeric or ceramic material.

6. The assembly as claimed in claim 1, wherein the bottom surface of said base substrate includes an area devoid of said conductive elements projecting from the bottom surface thereof and said first microelectronic subassembly is aligned with the area devoid of said conductive elements.

7. The assembly as claimed in claim 1, wherein said first microelectronic element is a radio frequency (RF) die overlying a first surface of said first dielectric substrate, said first microelectronic subassembly further comprising one or more passive components overlying a second surface of said first dielectric substrate, said one or more passive components being electrically interconnected with said RF die.

8. The assembly as claimed in claim 1, wherein said first microelectronic subassembly has a maximum height of 350 microns and said conductive elements projecting from the bottom surface of said base substrate have a minimum height of 350 microns.

9. The assembly as claimed in claim 1, wherein said first microelectronic element has a digital section and an analog section, said first dielectric substrate having an area that is devoid of said first conductive posts, the area being in alignment with the analog section of said first microelectronic element.

10. The assembly as claimed in claim 1, wherein said second microelectronic element comprises a digital signal processing (DSP) die or a memory die.

11. The assembly as claimed in claim 1, wherein said second microelectronic subassembly further comprises a third dielectric substrate overlying said second dielectric substrate, a third microelectronic element connected with said third dielectric substrate and third conductive posts projecting from said third dielectric substrate toward said second dielectric substrate.

12. The assembly as claimed in claim 11, wherein said second and third microelectronic elements are separated from one another by one of said second and third dielectric substrates.

13. The assembly as claimed in claim 11, wherein said second microelectronic element is a digital signal processing (DSP) die and said third microelectronic element is a memory die.

14. The assembly as claimed in claim 13, wherein said assembly comprises a global positioning system (GPS) receiver, said GPS receiver including a radio frequency (RF) die, said digital signal processing (DSP) die and said memory die.

15. The assembly as claimed in claim 1, wherein the bottom surface of said base substrate has a recess formed therein and said first microelectronic subassembly is at least partially disposed in the recess for minimizing the height of said stacked microelectronic assembly.

16. The assembly as claimed in claim 15, wherein said first microelectronic subassembly comprises at least one passive component overlying a top surface of said first dielectric substrate, said at least one passive component being at least partially disposed in the recess formed in said base substrate.

17. The assembly as claimed in claim 1, wherein said base substrate has a plurality of conductive lands accessible at a bottom surface thereof, said conductive lands being spaced from one another on a pitch of 400 microns or less.

18. The assembly as claimed in claim 17, wherein said conductive elements projecting from said base substrate are solder spheres attached to said conductive lands, said solder spheres having a diameter of 375 microns or less.

19. The assembly as claimed in claim 1, wherein said base substrate is a circuitized substrate having a higher modulus of elasticity than said first and second dielectric substrates.

20. The assembly as claimed in claim 1, wherein said first conductive posts include etched conductive posts.

21. The assembly as claimed in claim 1, wherein said first conductive posts consist essentially of copper.

22. The assembly as claimed in claim 1, wherein said first conductive posts include copper.

23. The assembly as claimed in claim 22, wherein said first conductive posts are bonded to contacts of said base substrate with solder.

24. The assembly as claimed in claim 1, wherein said first conductive posts consist essentially of solid metal.

25. The assembly as claimed in claim 24, wherein said first conductive posts are bonded to contacts of said base substrate with solder.

26. A stacked microelectronic assembly comprising:
a base substrate including a top surface, a bottom surface and conductive elements projecting from the bottom surface thereof;
a microelectronic subassembly underlying the bottom surface of said base substrate, said microelectronic subassembly including a dielectric substrate having a top surface and a bottom surface, a first microelectronic element attached to the top surface of said dielectric substrate, a second microelectronic element attached to the bottom surface of said dielectric substrate and conductive posts projecting from the top surface of said dielectric substrate toward the bottom surface of said base substrate for electrically interconnecting said first and second microelectronic elements with said base substrate, said conductive posts having at least one of cylindrical or frusto-conical shape.

27. The assembly as claimed in claim 26, wherein said first microelectronic element is a semiconductor chip and said second microelectronic element is a passive component.

28. The assembly as claimed in claim 27, wherein said semiconductor chip is a radio frequency (RF) die and said passive component is a decoupling capacitor.

29. The assembly as claimed in claim 28, wherein said RF die has a thickness of less than 100 microns.

30. The assembly as claimed in claim 26, wherein said conductive elements projecting from the bottom surface of said base substrate have a first height and said microelectronic subassembly has a second height that is less than the first height of said conductive elements.

31. The assembly as claimed in claim 26, wherein said base substrate is more rigid than said dielectric substrate and said dielectric substrate is a flexible dielectric film.

32. The assembly as claimed in claim 26, further comprising a second microelectronic subassembly overlying the top surface of said base substrate, said second microelectronic subassembly including a second dielectric substrate, a second microelectronic element connected with said second dielectric substrate and second conductive posts projecting from said second dielectric substrate toward the top surface of said base substrate for electrically interconnecting said second microelectronic element and said base substrate.

33. The assembly as claimed in claim 26, wherein said assembly comprises a global positioning system (GPS) receiver, said GPS receiver including a radio frequency (RF) die, said digital signal processing (DSP) die and said memory die.

34. A stacked microelectronic assembly comprising:
a base substrate including a top surface, a bottom surface and conductive elements projecting from the bottom surface thereof;
a multilayer microelectronic subassembly overlying the top surface of said base substrate, said multilayer microelectronic subassembly comprising:
a first dielectric substrate, a first semiconductor die connected with said first dielectric substrate and first conductive posts projecting from said first dielectric substrate for electrically interconnecting said first semiconductor die and said base substrate, said first conductive posts having at least one of cylindrical or frusto conical shape; and
a second dielectric substrate overlying said first dielectric substrate, a second semiconductor die connected with said second dielectric substrate and second conductive posts projecting from said second dielectric substrate toward said first dielectric substrate.

35. The assembly as claimed in claim 34, wherein said first semiconductor die is a digital signal processing (DSP) die and said second semiconductor die is a memory die.

36. The assembly as claimed in claim 35, wherein said assembly is a global positioning system (GPS) receiver, said GPS receiver including a radio frequency (RF) die.

37. The assembly as claimed in claim 34, wherein said first and second semiconductor die are separated from one another by one of said first and second dielectric substrates.

38. The assembly as claimed in claim 34, wherein said first and second dielectric substrates are more flexible than said base substrate.

39. A stacked microelectronic assembly comprising:
a base substrate having an outer perimeter defining an area, said base substrate including a top surface, a bottom surface and conductive elements projecting from the bottom surface;
a first microelectronic subassembly underlying the bottom surface of said base substrate, said first microelectronic subassembly including a first flexible dielectric substrate, a first microelectronic element connected with said first flexible dielectric substrate and first conductive posts projecting from said first flexible dielectric substrate toward the bottom surface of said base substrate for electrically interconnecting said first microelectronic subassembly and said base substrate, said first conductive posts having at least one of cylindrical or frusto-conical shape;
a second microelectronic subassembly overlying the top surface of said base substrate, said second microelectronic subassembly including a second flexible dielectric substrate, a second microelectronic element connected with said second flexible dielectric substrate and second conductive posts projecting from said second dielectric substrate toward the top surface of said base substrate for electrically interconnecting said second microelectronic subassembly and said base substrate, wherein each of said first and second microelectronic elements covers an area that is greater than 50% of the area of said base substrate.

40. The assembly as claimed in claim 39, wherein said second microelectronic subassembly further comprises a third flexible dielectric substrate overlying said second flexible dielectric substrate, a third microelectronic element connected with said third flexible dielectric substrate and third conductive posts projecting from said third flexible dielectric substrate toward said second flexible dielectric substrate, wherein said third microelectronic element covers an area that is greater than 50% of the area of said base substrate.

41. The assembly as claimed in claim 40, wherein said stacked microelectronic assembly has a thickness of less than 1 mm.

42. The assembly as claimed in claim 40, wherein said first, second and third microelectronic elements are selected from the group of semiconductors consisting of a radio frequency (RF) die, a digital signal processing (DSP) die and a memory die.

43. The assembly as claimed in claim 42, wherein said assembly comprises a global positioning system (GPS) component.

44. A stacked microelectronic assembly comprising:
   a base substrate having a top surface, a bottom surface and conductive elements projecting from the bottom surface;
   a first microelectronic subassembly underlying the bottom surface of said base substrate, said first microelectronic subassembly including a first flexible dielectric substrate having a top surface and a bottom surface, a first microelectronic element overlying the top surface of said first flexible dielectric substrate and first conductive posts projecting from the top surface of said first flexible dielectric substrate toward the bottom surface of said base substrate for electrically interconnecting said first microelectronic element and said base substrate, said first conductive posts having cylindrical or frusto-conical shape;
   a second microelectronic subassembly overlying the top surface of said base substrate, said second microelectronic subassembly comprising:
      a second flexible dielectric substrate having a top surface and a bottom surface, a second microelectronic element attached to said second flexible dielectric substrate and second conductive posts projecting from the bottom surface of said second flexible dielectric substrate toward the top surface of said base substrate for electrically interconnecting said second microelectronic element and said base substrate, and
      a third flexible dielectric substrate overlying said second flexible dielectric substrate, said third flexible dielectric substrate having a top surface and a bottom surface, a third microelectronic element attached to said third flexible dielectric substrate and third conductive posts projecting from the bottom surface of said third flexible dielectric substrate toward the top surface of said second flexible dielectric substrate for electrically interconnecting said third microelectronic element and said base substrate.

45. The assembly as claimed in claim 44, wherein said second and third microelectronic elements are separated from one another by one of said second and third flexible dielectric substrates.

46. The assembly as claimed in claim 44, wherein said first microelectronic element is a radio frequency die, said second microelectronic element is a digital signal processing die and said third microelectronic element is a memory die.

47. The assembly as claimed in claim 46, wherein said assembly comprises a global positioning system (GPS) component that includes said radio frequency die, said digital signal processing die and said memory die.

48. The assembly as claimed in claim 44, wherein said assembly has a height of 1 mm or less.

49. The assembly as claimed in claim 44, wherein the bottom surface of said base substrate has a recess and said first microelectronic subassembly is at least partially disposed in the recess.

* * * * *